(12) United States Patent
Campbell et al.

(10) Patent No.: US 7,978,473 B2
(45) Date of Patent: Jul. 12, 2011

(54) COOLING APPARATUS WITH COLD PLATE FORMED IN SITU ON A SURFACE TO BE COOLED

(75) Inventors: Levi A. Campbell, Poughkeepsie, NY (US); Richard C. Chu, Hopewell Junction, NY (US); Michael J. Ellsworth, Jr., Lagrangeville, NY (US); Bruce K. Furman, Saratoga Springs, NY (US); Madhusudan K. Iyengar, Woodstock, NY (US); Paul A. Lauro, Brewster, NY (US); Roger R. Schmidt, Poughkeepsie, NY (US); Da-Yuan Shih, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/706,912

(22) Filed: Feb. 17, 2010

(65) Prior Publication Data
US 2010/0142150 A1    Jun. 10, 2010

Related U.S. Application Data

(62) Division of application No. 12/143,289, filed on Jun. 20, 2008, now Pat. No. 7,731,079.

(51) Int. Cl.
*H05K 7/20* (2006.01)
*G06F 1/20* (2006.01)
*H01L 23/34* (2006.01)

(52) U.S. Cl. .......... 361/699; 361/679.53; 361/679.54; 361/702; 361/703; 361/704; 361/719; 228/183; 165/104.33; 165/185; 257/714

(58) Field of Classification Search .......... 361/679.46, 361/679.53–679.54, 699, 702–704, 707, 361/718–719; 165/80.4, 104.33, 185; 29/890.03; 228/185, 245, 254, 46, 183, 200; 257/714, 257/E23.101; 438/122
See application file for complete search history.

(56) References Cited

U.S. PATENT DOCUMENTS

| | | | | |
|---|---|---|---|---|
| 5,369,301 A | * | 11/1994 | Hayashi et al. | ........ 257/722 |
| 6,367,152 B1 | * | 4/2002 | Kataoka | ........ 29/890.03 |
| 6,397,941 B1 | * | 6/2002 | McCullough | ........ 165/185 |

(Continued)

FOREIGN PATENT DOCUMENTS
JP    2003218567 A    7/2003

*Primary Examiner* — Robert J Hoffberg
(74) *Attorney, Agent, or Firm* — Dennis Jung, Esq.; Kevin P. Radigan, Esq.; Heslin Rothenberg Farley & Mesiti P.C.

(57) ABSTRACT

A cooling apparatus and method of fabrication are provided for facilitating removal of heat from a heat-generating electronic device. The method of fabrication includes: obtaining a solder material; disposing the solder material on a surface to be cooled; and reflowing and shaping the solder material disposed on the surface to be cooled to configure the solder material as a base with a plurality of fins extending therefrom. In addition to being in situ-configured on the surface to be cooled, the base is simultaneously metallurgically bonded to the surface to be cooled. The solder material, configured as the base with a plurality of fins extending therefrom, is a single, monolithic structure thermally attached to the surface to be cooled via the metallurgical bonding thereof to the surface to be cooled.

20 Claims, 10 Drawing Sheets

U.S. PATENT DOCUMENTS

| | | |
|---|---|---|
| 6,444,496 B1 | 9/2002 | Edwards et al. |
| 6,528,878 B1 * | 3/2003 | Daikoku et al. ............. 257/714 |
| 6,851,186 B2 | 2/2005 | Liang |
| 6,886,625 B1 | 5/2005 | Sagal et al. |
| 6,946,190 B2 | 9/2005 | Bunyan |
| 7,126,822 B2 | 10/2006 | Hu et al. |
| 7,219,713 B2 | 5/2007 | Gelorme et al. |
| 7,253,523 B2 | 8/2007 | Dani et al. |
| 7,364,063 B2 | 4/2008 | Schaenzer et al. |
| 7,510,108 B2 | 3/2009 | Lawlyes et al. |
| 7,521,787 B2 | 4/2009 | Ohshima |
| 7,731,079 B2 * | 6/2010 | Campbell et al. ............. 228/245 |
| 2003/0075312 A1 | 4/2003 | Panek |
| 2004/0088860 A1 | 5/2004 | Liang |
| 2004/0188073 A1 | 9/2004 | Okamoto et al. |
| 2005/0284918 A1 | 12/2005 | Martin et al. |
| 2007/0177356 A1 * | 8/2007 | Panek ......................... 361/712 |
| 2008/0080144 A1 * | 4/2008 | Machiroutu ................. 361/719 |

* cited by examiner

COOLING APPARATUS WITH COLD PLATE FORMED IN SITU ON A SURFACE TO BE COOLED

This application is a divisional of co-pending U.S. patent application Ser. No. 12/143,289, filed Jun. 20, 2008, entitled "COOLING APPARATUS AND METHOD OF FABRICATION THEREOF WITH A COLD PLATE FORMED IN SITU ON A SURFACE TO BE COOLED," the entirety of which is hereby incorporated herein by reference.

BACKGROUND

The present invention relates to heat transfer mechanisms, and more particularly, to cooling apparatuses, cooled electronic modules and methods of fabrication thereof for removing heat generated by one or more electronic devices. Still more particularly, the present invention relates to cooling apparatuses and methods employing a plurality of thermally conductive fins extending from a thermally conductive base attached to a surface to be cooled, for example, of a heat-generating electronic module.

As is known, operating electronic devices produce heat. This heat should be removed from the devices in order to maintain device junction temperatures within desirable limits, with failure to remove the heat resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices therefore mandates the development of aggressive thermal management techniques, such as using liquid cooling. Various types of liquid coolants provide different cooling capabilities. In particular, fluids such as refrigerants or other dielectric liquids (e.g., fluorocarbon liquid) exhibit lower thermal conductivity and specific heat properties, when compared to liquids such as water or other aqueous fluids. Dielectric liquids have an advantage, however, in that they may be placed in direct physical contact with electronic devices and interconnects without adverse affects such as corrosion or electrical short circuits. Other cooling liquids, such as water or other aqueous fluids, exhibit superior thermal conductivity and specific heat compared to dielectric fluids. Water-based coolants, however, must be kept from physical contact with electronic devices and interconnects, since corrosion and electrical short circuit problems are likely to result from such contact. Various methods have been disclosed in the art for using water-based coolants, while providing physical separation between the coolants and the electronic device(s). With liquid-based cooling apparatuses, however, it is still necessary to attach the cooling apparatus to the electronic device. This attachment results in a thermal interface resistance between the cooling apparatus and the electronic device. Thus, in addition to typical liquid cooling issues regarding sealing, clogging due to particulate contamination, thermal conductivity of the cooling apparatus, effectiveness of the interface to the electronic device as well as the thermal expansion match between the cooling apparatus and the electronic device and manufacturability, need to be addressed. The invention disclosed herein presents a high-performance liquid cooling apparatus and method of fabrication that addresses the above-noted considerations for liquid-cooling-based apparatuses.

BRIEF SUMMARY

In one aspect, a cooling apparatus is provided which includes a solder material attached to a surface to be cooled. The solder material is a thermally conductive material and is in situ-configured on the surface to be cooled as a base with a plurality of fins extending therefrom. The solder material, including the base with a plurality of fins extending therefrom, is a single, monolithic structure which is metallurgically bonded to the surface to be cooled.

In a further aspect, a cooled electronic module is provided which includes a substrate with at least one heat generating electronic device attached thereto. The cooled electronic module further includes a cooling apparatus for cooling a surface to be cooled of the at least one heat generating electronic device. The cooling apparatus includes: a solder material metallurgically bonded to the surface to be cooled, wherein the surface to be cooled comprises part of the at least one heat-generating electronic device or a surface thermally coupled to the at least one heat-generating electronic device. The solder material is a thermally conductive material, and is in situ-configured on the surface to be cooled as a base with a plurality of fins extending therefrom. The solder material, including the base with a plurality of fins extending therefrom, is a single, monolithic structure which is metallurgically bonded to the surface to be cooled.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

As used herein, "electronic device" comprises any heat generating electronic component of a computer system or other electronic system requiring cooling. In one example, the electronic device includes an integrated circuit chip. The term "cooled electronic module" includes any electronic module with cooling and at least one electronic device, with single chip modules and multichip modules being examples of an electronic module to be cooled.

Generally stated, provided herein is an enhanced cooling apparatus and method of fabrication which allow for high heat transfer rate from a surface of an electronic device to be cooled using a liquid cooling approach. In one embodiment, the cooling liquid comprises a dielectric fluid, such as a fluorocarbon liquid. However, the concepts disclosed herein are readily adapted to use with other types of coolant. For example, the coolant may comprise a water-based fluid, a brine, a liquid metal, or other similar coolant, or a refrigerant, while still maintaining the advantages and unique features of the present invention. Further, the coolant may be employed in single-phase or two-phase mode.

As discussed above, the ever-increasing rise of cooling requirements of commercial computer products has been driven by an exponential increase in microprocessor performance over the last decade. Almost all electrical energy consumed by an integrated circuit chip package is released into the surroundings as heat, which places a significant burden on the cooling apparatus. Existing cooling technologies typically utilize air to carry heat away from an integrated circuit chip, and reject it to the ambient. Heat sinks with heat pipes or vapor chambers are the most commonly used air-cooling devices. These cooling techniques are, however, inherently limited with respect to their ability to extract heat from semiconductor devices with high power densities. Thus, the need to cool current and future high heat load and high heat flux electronics mandates the development of aggressive thermal management techniques, such as liquid-cooling using jet impingement techniques, and using finned cold plate structures.

Figure 1:
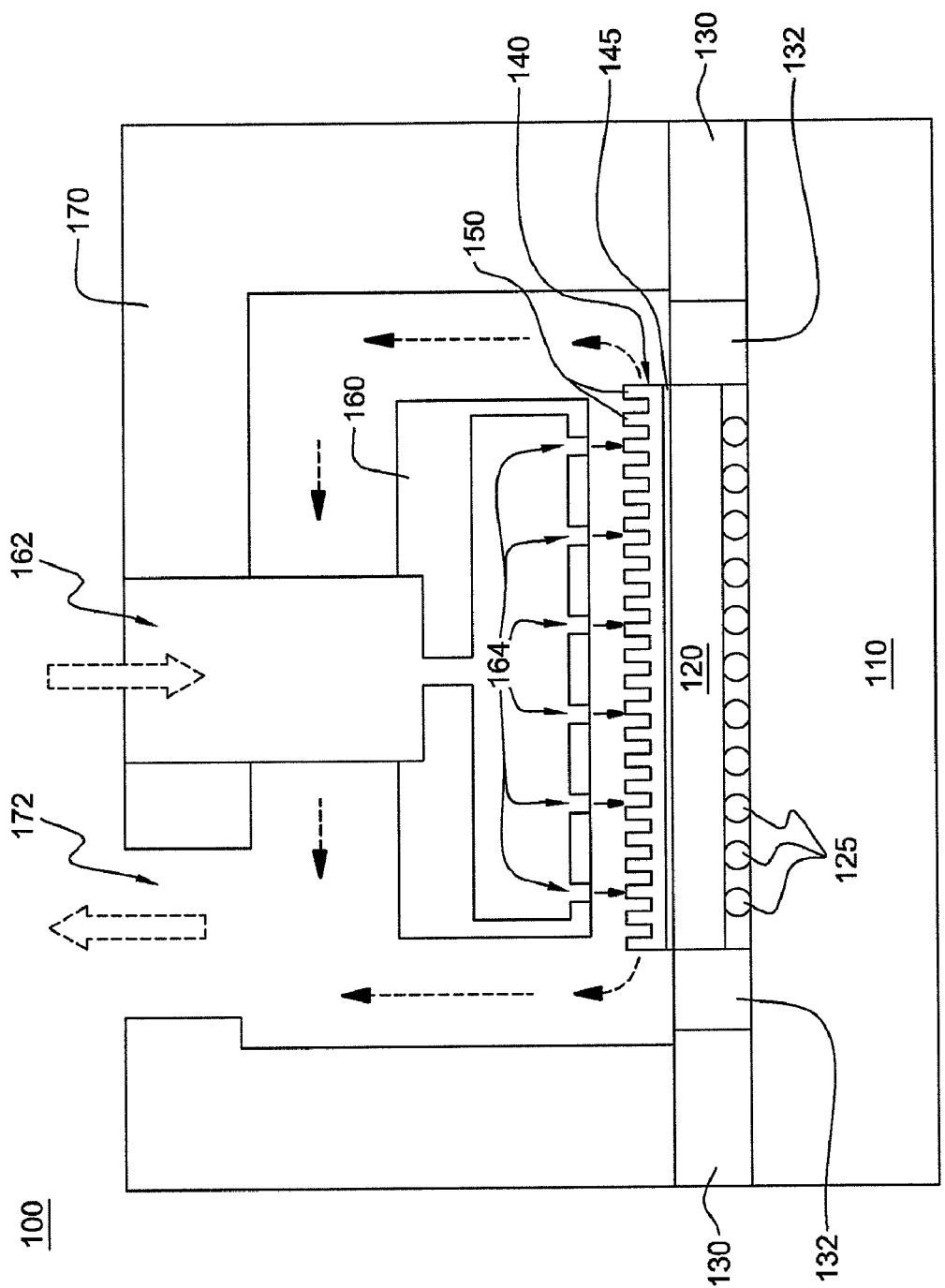
FIG. 1 is a cross-sectional elevational view of one embodiment of a liquid-cooled electronic module.

Reference is now made to the drawings, wherein the same reference numbers used throughout different figures designate the same or similar components. FIG. 1 depicts one embodiment of one type of cooled electronic module, generally denoted 100. In this embodiment, cooled electronic module 100 includes a substrate 110, which may include conductive wiring (not shown) on an upper surface thereof and/or embedded therein. An integrated circuit chip 120 is electrically connected to the wiring of substrate 110 via, for example, solder ball connections 125. A sealing structure 130 and sealant 132 facilitate isolation of the active circuit portion of the integrated circuit 120 from liquid coolant within the module. A microstructure heat sink 140 is coupled to integrated circuit chip 120 via a thermal interface 145 (e.g., silicone, epoxy, solder). A housing 170 is hermetically sealed to sealing structure 130 via, for example, solder or brazing. Within the housing, a plurality of pin fins 150 extend from microstructure heat sink 140 into a coolant flow path defined by the housing. In one example, these pin fins each comprise a discrete pin fin fabricated of copper. The coolant flow path includes an inlet manifold structure 160 disposed above the microstructure heat sink 140. Inlet manifold structure 160 includes an inlet 162 and a plurality of orifices 164, which may comprise micro-scaled jet orifices. Housing 170 includes a liquid coolant outlet 172 for removal of coolant after contacting the plurality of pin fins 150 and the base of microstructure heat sink 140. Note that although the manifold approach described above employs central coolant inlets with peripheral outlets, a number of different approaches may be incorporated without departing from the scope of the present invention.

The jet impingement, liquid-cooled electronic module configuration of FIG. 1 has various issues associated therewith. These issues include sealing and clogging due to particulate contamination, thermal conductivity of the cold plate material, effectiveness of the thermal interface to the electronic device, thermal expansion mismatch between the cold plate and the electronic device, and manufacturability. Further, the cooled electronic module of FIG. 1, although comprising an aggressive liquid cooling design, can be expensive to manufacture.

In contrast, today's high-volume server market, even when liquid-cooled, requires only medium performance liquid-cooled cold plates. Further, the liquid-cooled cold plates need to be provided at a greatly reduced cost relative to the overall cost of the cooled electronic module design of FIG. 1. The cooling apparatuses and methods of fabrication thereof described below address these needs.

Figure 2:
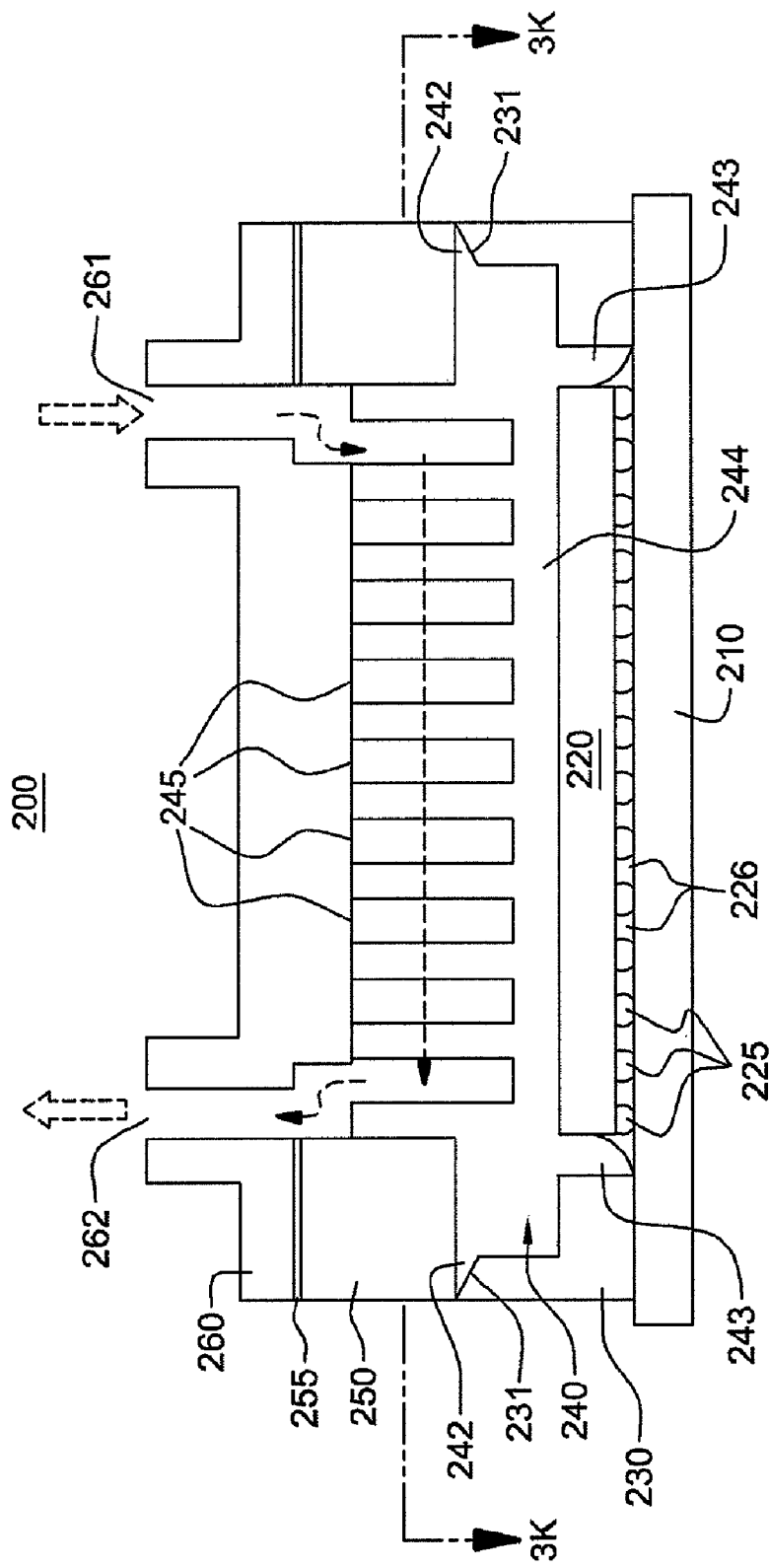
FIG. 2 is a cross-sectional elevational view of one embodiment of a cooled electronic module with a cooling apparatus, in accordance with an aspect of the present invention.

FIG. 2 depicts one embodiment of a cooled electronic module, generally denoted 200, in accordance with an aspect of the present invention. This cooled electronic module 200 includes a substrate 210, which may include conductive wiring (not shown) on an upper surface thereof and/or embedded therein. An integrated circuit chip 220 is electrically connected to the wiring of substrate 210 via, for example, solder ball connections 225. An underfill material 226 functions, in part, to isolate the active region of integrated circuit chip 220.

A solder material 240 is thermally attached via a metallurgical bond to the upper surface of integrated circuit chip 220. As explained further below, solder material 240 is a thermally conductive material, which is in situ-configured as a base 244, with a plurality of fins 245 extending therefrom. Note that the phrase "solder material", in addition to encompassing a metal or metallic alloy which may be reflowed to join surfaces, is inclusive herein of any of today's high thermal conductivity plastics, which may be similarly reflowed to join surfaces together.

A housing structure surrounds solder material 240 and defines a coolant flow chamber through which liquid coolant passes. As illustrated, the plurality of fins 245 extend within the coolant flow chamber of the cooling apparatus. The housing structure includes an L-shaped lower support structure 230 which surrounds the periphery of integrated circuit chip 220 and, in this embodiment, is spaced from the sides of integrated circuit chip 220. A chamfer 231 at the top of L-shaped lower support structure 230 is filled by solder material 242, which bonds a lower surface of an upper support structure 250 to the solder material and the L-shaped lower support structure 230, and forms a liquid-tight seal. Additionally, solder material 243 fills the space between the L-shaped lower support structure and the sides of integrated circuit chip 220, to facilitate isolation of the active circuitry of integrated circuit chip 220 and solder ball connections 225 from liquid coolant flowing through the coolant flow chamber defined by the housing structure. A lower melting point solder or epoxy material 255 on the upper surface of upper support structure 250 bonds a manifold cover plate 260 to upper support structure 250. Taken together, the L-shaped lower support structure 230, upper support structure 250 and manifold cover plate 260 define the housing structure, which surrounds the solder material 240 and the integrated circuit chip 220 to be cooled. Manifold cover plate 260 includes a coolant inlet port 261 and a coolant outlet port 262 to allow for the ingress and egress of liquid coolant through the coolant flow chamber, as illustrated.

One embodiment for fabricating a cooled electronic module such as depicted in FIG. 2 is described below with reference to FIGS. 3A-3K.

Figure 3A:
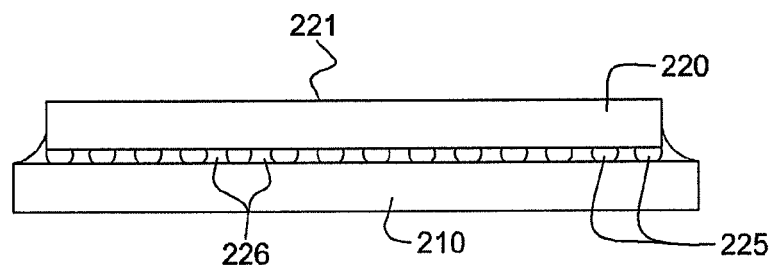
FIG. 3A illustrates one intermediate assembly embodiment of an integrated circuit chip disposed on and electrically connected to a substrate, for which a cooling apparatus is to be provided, in accordance with an aspect of the present invention.
Figure 3B:
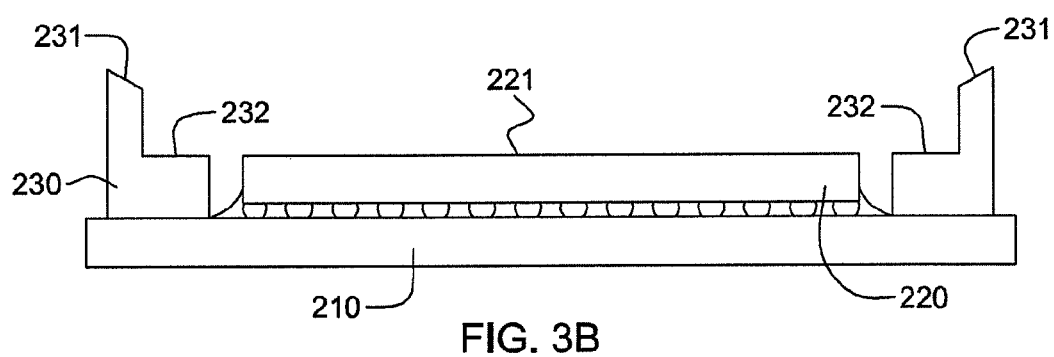
FIG. 3B illustrates the assembly embodiment of FIG. 3A subsequent to bonding an L-shaped lower support structure to the substrate, which encircles the integrated circuit chip and provides a portion of a cold plate housing structure, in accordance with an aspect of the present invention.

Beginning with FIG. 3A, an intermediate assembly embodiment is illustrated, which includes substrate 210 and integrated circuit chip 220 disposed thereon and electrically connected thereto via, for example, solder ball connections 225. An underfill material 226 surrounds solder ball connections 225 to electrically isolate and protect the connections. A surface to be cooled 221 of integrated circuit device 220 is assumed to be metalized in this first step. As one example, integrated circuit chip 220 may comprise a silicon die microprocessor, and the metallization facilitates metallurgical bonding of the subsequently applied solder material to the surface to be cooled. By way of example, two chip metallization layers that could be employed are chrome-nickel-gold (CrNiAu), or titanium-nickel-gold (TiNiAu). With these metallization layers, the first-named metal is an adhesion layer (Cr or Ti), the second metal is a wetting barrier layer (Ni), and the third metal is an anti-oxidation layer (Au). In the case of the CrNiAu metallization layer, the Cr layer is approximately 500 angstroms thick, the Ni layer is approximately 5,000 angstroms thick, and the Au layer is approximately 500 angstroms thick. The use of chip metallization enables a metallurgical bond to be created between the solder material and the surface to be cooled. This metallurgical bond has significant thermal and structural benefits. The term "metallurgical bond" refers to a bond which is a metal-atom-to-metal-atom bond between two metal surfaces being joined. It is an oxide-free bond. Both these features, that is, metal-atom-to-metal-atom bond and absence of oxides, produce an excellent interface for heat transfer purposes.

In a next step, L-shaped lower support structure 230 is added to the assembly. In the illustrated embodiment, this is accomplished by bonding L-shaped lower support structure 230 to substrate 210. As illustrated, L-shaped lower support structure 230 encircles integrated circuit chip 220 and, in one embodiment, is spaced from the side surfaces thereof. L-shaped lower support structure 230 includes a land 232 and a chamfered upper surface 231. Land 232 is, in one embodiment, configured to be approximately parallel and co-planar with surface to be cooled 231 of integrated circuit chip 220. In one embodiment, L-shaped lower support structure is a pre-formed, frame-shaped, support structure fabricated of copper.

Figure 3C:
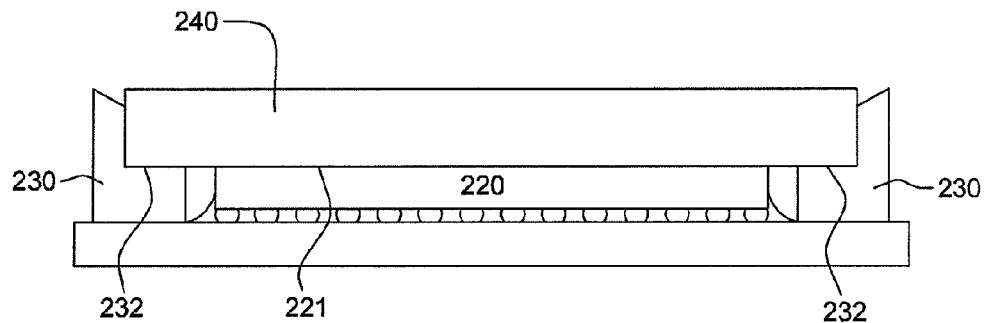
FIG. 3C illustrates the assembly embodiment of FIG. 3B subsequent to positioning of a solder perform material on the integrated circuit chip and within the L-shaped lower support structure, in accordance with an aspect of the present invention.

As illustrated in FIG. 3C, the land (or step) 232 in L-shaped lower support structure 230 and the metalized surface to be cooled 221 accommodate a solder material 240. This solder pre-form is, in one embodiment, an appropriately dimensioned foil which is placed on the metalized surface to be cooled of integrated circuit chip 220. Solder material 240 is sized to fit securely within the step of L-shaped lower support structure 230. By way of example, the solder material 240 comprises indium, and may be provided by Indium Corporation, of Utica, New York. Further, the solder material may be fabricated as a 0.1-0.5 mm thick foil. In one embodiment, the indium solder pre-form has a melting point of 154° C., which is assumed to be below the melting point of integrated circuit chip 220 active circuitry and solder ball connections 225.

Figure 3D:
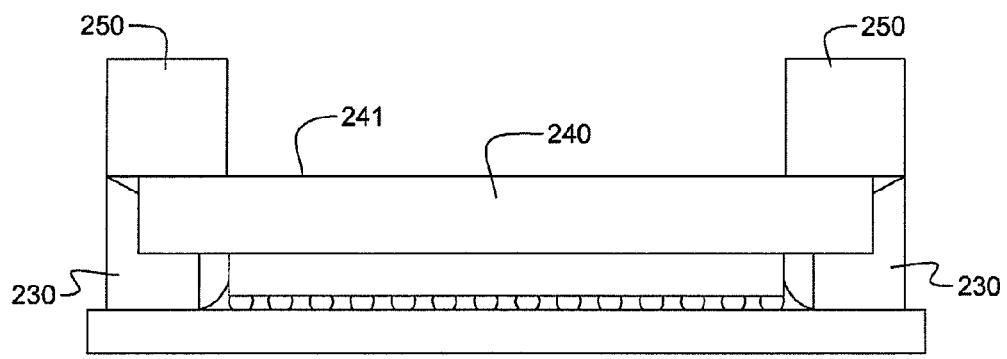
FIG. 3D illustrates the assembly embodiment of FIG. 3C subsequent to disposition of an upper support structure over the solder pre-form material and the L-shaped lower support structure, in accordance with an aspect of the present invention.

In a next step, illustrated in FIG. 3D, upper support structure 250 is placed on top of upper surface 241 of the solder material, around the outer periphery thereof, and on top of L-shaped lower support structure 230. The upper support structure 250 may also comprise copper, or alternatively, the upper support structure or L-shaped lower support structure may comprise nickel.

Figure 3E:
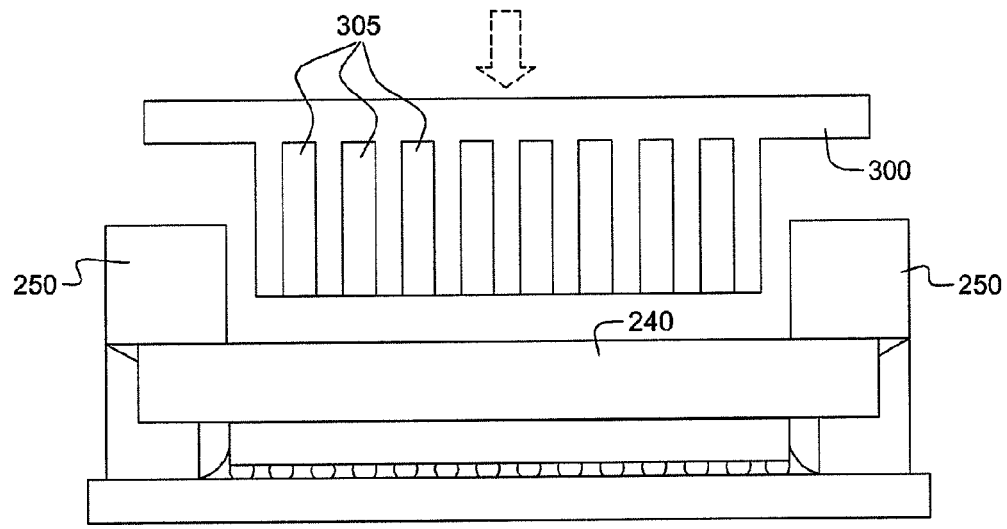
FIG. 3E illustrates the assembly embodiment of FIG. 3D and shows positioning of a solder shaping tool over the assembly, in an accordance with an aspect of the present invention.
Figure 3F:
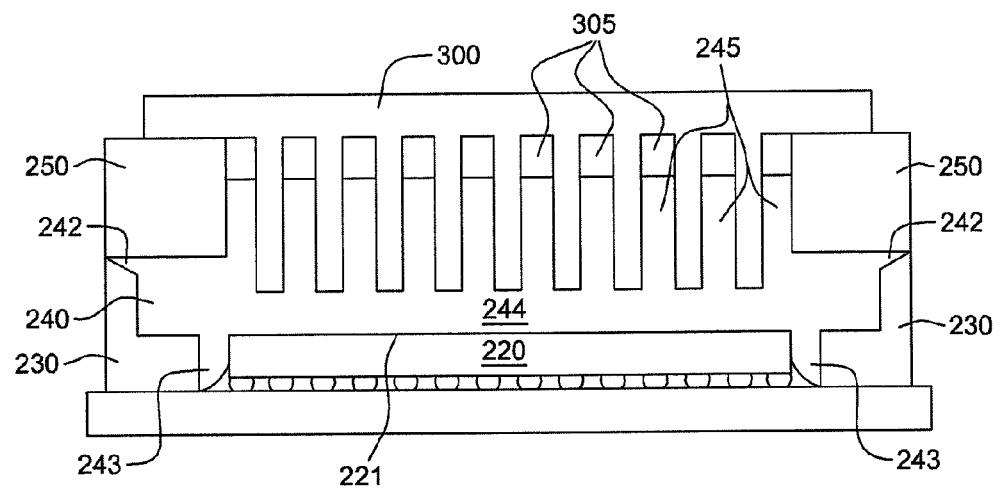
FIG. 3F illustrates the assembly embodiment of FIG. 3E with the solder shaping tool shown extended into the assembly to facilitate configuring the solder material as a base with a plurality of fins extending therefrom, in accordance with an aspect of the present invention.

FIG. 3E illustrates the assembly of FIG. 3D, with a solder shaping tool 300 positioned over the assembly. In this embodiment, solder shaping tool 300 includes a plurality of channels 305 within which solder material is to reflow to form a plurality of pin fins, as described further below. As solder shaping tool 300 is brought down into contact with solder material 240, the solder material is heated, and force is applied to the solder shaping tool. In one embodiment, the entire environment within which the assembly resides is heated, or alternatively, only the solder shaping tool itself is heated to apply thermal energy to solder material 240 for reflowing of the material. The solder shaping tool 300 may have various configurations designed to produce a desired plurality of fin configurations in the solder material. As illustrated in FIG. 3K, the solder shaping tool may be designed to produce a plurality of square-shaped pin fins. Alternatively, pin fins of any desired shape and size could be produced by appropriately configuring and sizing channels 305 of solder shaping tool 300. Additionally, although not shown, air bleed holes or notches may be provided within solder shaping tool 300 to allow air originally housed in cavities 305 and 242 (see FIGS. 3E & 3F) to escape as the cavities fill with the reflowing solder material.

To satisfactorily reflow the solder material, the temperature of the solder shaping tool 300 and the solder material should exceed the melting temperature of the solder material by about 10° C.-30° C. For indium solder, this means temperatures in the 164° C.-184° C. range. The reflowed solder is illustrated in FIG. 3F. As illustrated, the reflowed solder material fills the volume 242 between the chamfered surface of L-shaped lower support structure 230 and upper support structure 250, thus creating a liquid-tight seal or joint between these structures, which is also structurally sound. Additionally, solder material 240 flows into and fills the space 243 between L-shaped lower support structure 230 and integrated circuit chip 220, as well as partially fills the plurality of channels 305 in solder shaping tool 300, thereby defining the plurality of fins 245. Simultaneous with reflowing and shaping the solder material, base 244 is formed metallurgically bonded to the surface to be cooled 221 of integrated circuit chip 220.

Figure 3G:
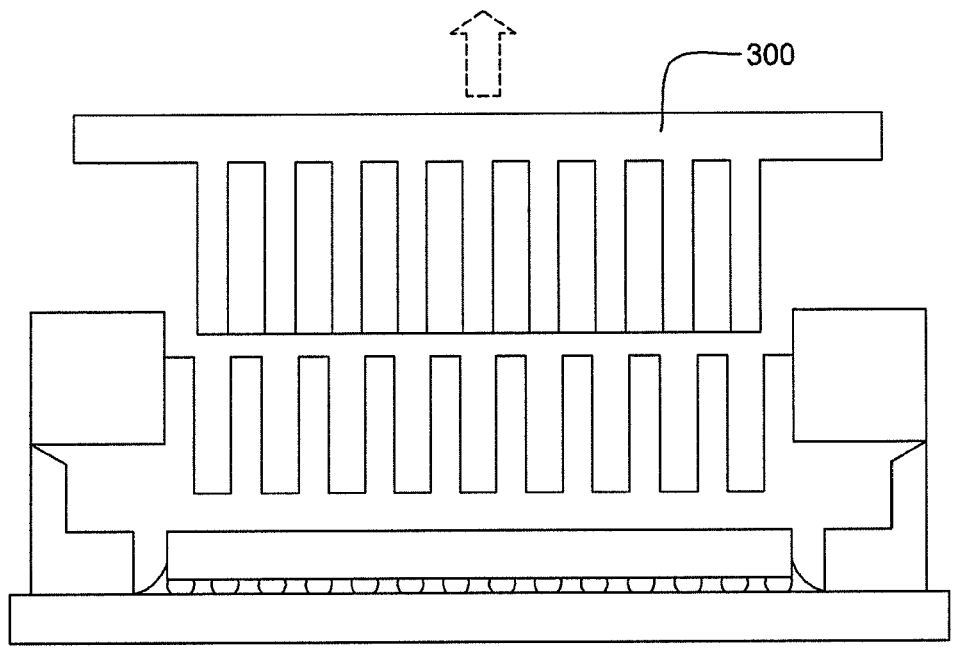
FIG. 3G illustrates the assembly embodiment of FIG. 3F after reflowing and shaping of the solder material, and with the solder shaping tool refracted, in accordance with an aspect of the present invention.
Figure 3H:
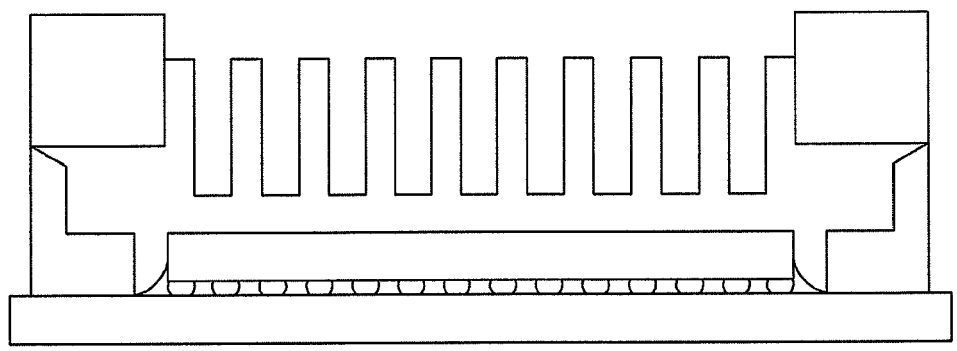
FIG. 3H illustrates the assembly embodiment of FIG. 3G with the solder shaping tool removed, in accordance with an aspect of the present invention.

After the solder material has been in situ-configured as illustrated, solder shaping tool 300 is retracted, as shown in FIG. 3G. In one embodiment, solder shaping tool 300 is fabricated of nickel, which has a higher melting point than indium solder, and comprises a surface which readily separates from the indium solder, once the solder has been shaped as illustrated in FIG. 3F. The resulting intermediate structure is illustrated in FIG. 3H. As explained further below, this structure comprises a lower portion of a low cost liquid-cooled cold plate, in accordance with an aspect of the present invention.

Figure 3I:
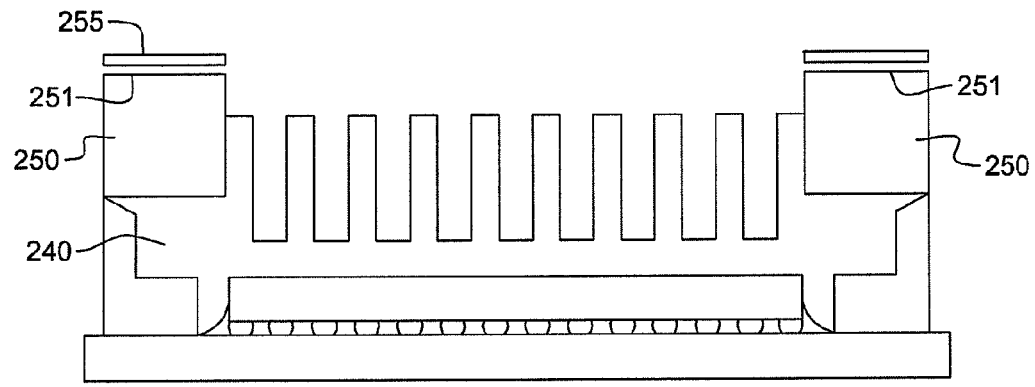
FIG. 3I illustrates the assembly embodiment of FIG. 3H, subsequent to disposition of a lower melting point solder material onto exposed upper surfaces of the upper support structure, in accordance with an aspect of the present invention.
Figure 3J:
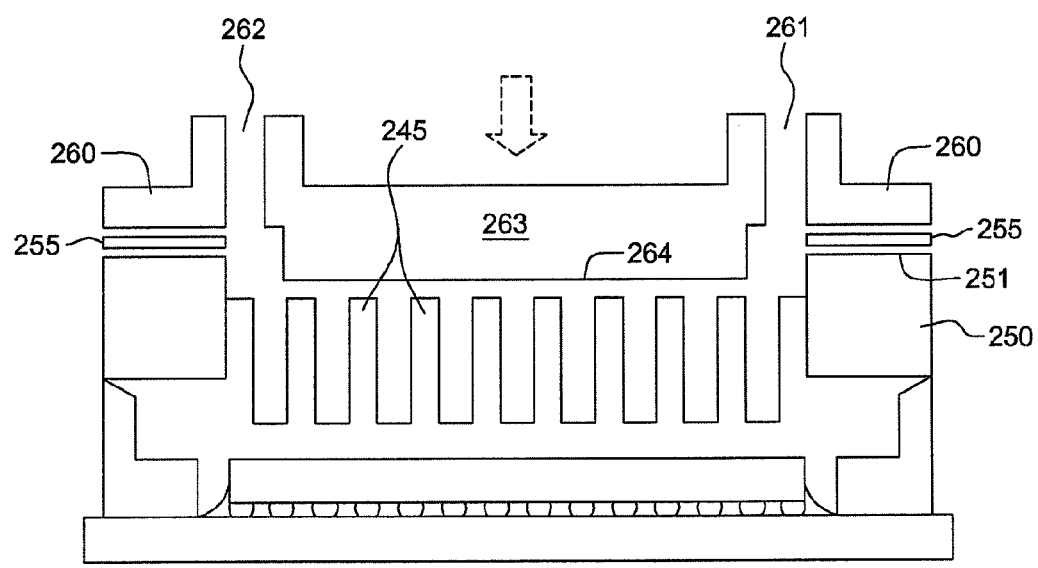
FIG. 3J illustrates the assembly embodiment of FIG. 3I subsequent to positioning of a manifold cover plate over the assembly for securing to the upper surfaces of the upper support structure, in accordance with an aspect of the present invention.
Figure 3K:
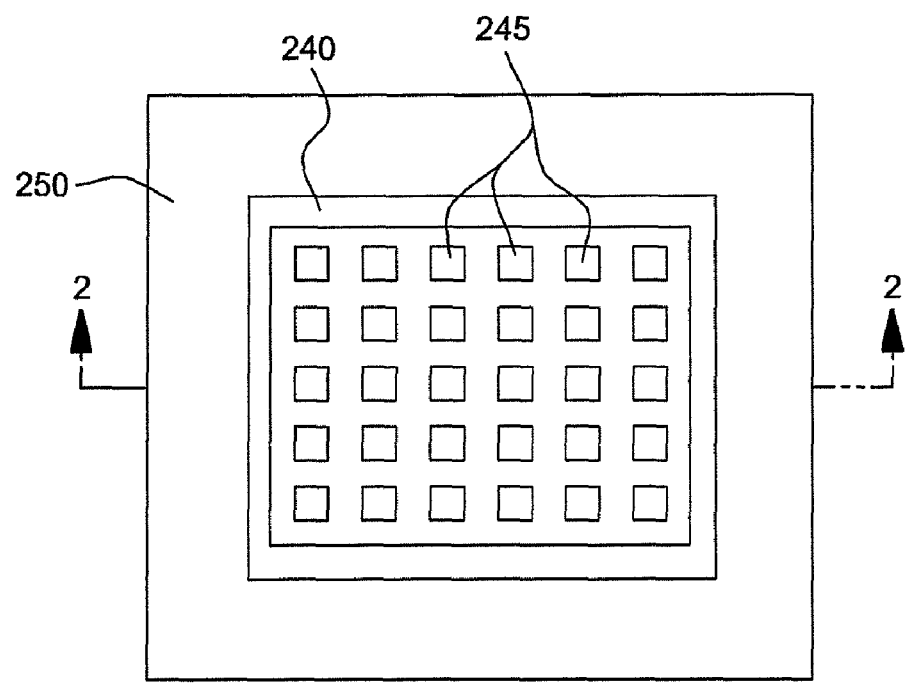
FIG. 3K is a cross-sectional plan view of the resultant cooled electronic module of FIG. 2, taken along line 3K-3K thereof, in accordance with an aspect of the present invention.

In FIG. 3I, a secondary, lower melting point solder 255 is applied to the upper surface 251 of upper support structure 250. This lower melting point solder may be a secondary solder pre-form, for example, having a rectangular ring shape, that is placed onto the exposed upper surface of upper support structure 250. By way of example, this secondary pre-form may be a Pb—Sn based solder, with a melting point of 125° C. It is significant that the secondary solder be chosen so that its melting point is at least 20° C.-30° C. less than the melting point of the primary solder material 240 used to create the fin structure, since it is desirable to ensure that the solder fin structure and the joints defined by solder material 240 are unaffected by the secondary soldering process.

In a next step, a manifold cover plate 260, configured to mate to the assembly of FIG. 3I, is brought into contact with the secondary solder 255 disposed on the upper surface 251 of upper support structure 250. This manifold cover plate 260 is configured to include an inlet coolant port 261 and an outlet coolant port 262. Further, manifold cover plate 260 includes a central portion 263 with a central surface 264 configured to contact at least some fins of the plurality of fins 245 when manifold cover plate 260 is sealed to the upper surface of upper support structure 250. By contacting the plurality of fins, liquid coolant passing through the coolant flow chamber defined within the housing structure necessarily flows through and around the plurality of fins. After the manifold cover plate 260 is placed onto the secondary solder material, it is compressed against the assembly, and the entire assembly is heated to approximately 10° C. greater than the melting point of the secondary solder material 255. The resultant structure, which is a low cost cold plate structure, is illustrated in FIG. 2, and described above.

FIG. 3K is a cross-sectional plan view of the cooled electronic module 200 of FIG. 2, taken along line 3K-3K. In this plan view, a plurality of square-shaped pin fins 245 are illustrated, again by way of example only. The pin fins can have a variety of shapes and configurations, as determined by the solder shaping tool described above. Solder material 240 is illustrated about the periphery of the coolant flow chamber, which facilitates sealing of the solder material to upper support structure 250.

Those skilled in the art will note from the above discussion that provided herein is a novel liquid-cooled cold plate, which is fabricated, in part, of an in situ-formed solder material (such as indium). It is anticipated that an indium solder preform such as described above will cost approximately $0.50, with the entire cold plate being manufactured for about $1-2. A method of manufacture is presented wherein a solder fin array is created in situ directly on the surface to be cooled, for example, the back surface of an integrated circuit chip. This results in the liquid manifold-based cooling apparatus being attached directly to the surface to be cooled via a metallurgical process and bond. The use of different solder materials with different melting points is described, one for creating the fin structure, and the liquid-tight seals, and the other for joining the manifold cover plate to the balance of the housing structure. The method presented is a staggered reflow process, where subsequent reflow steps do not result in melting previously reflown and shaped solder. A dielectric coolant may be advantageous. The chemically inert properties of such a coolant ensure that the coolant does not react with the solder material. Also, a dielectric coolant provides a sufficient cooling capability for high volume integrated circuit chips, such as high volume servers. The dielectric coolant could be used in a single-phase regime, or in a two-phase regime.

Figure 4A:
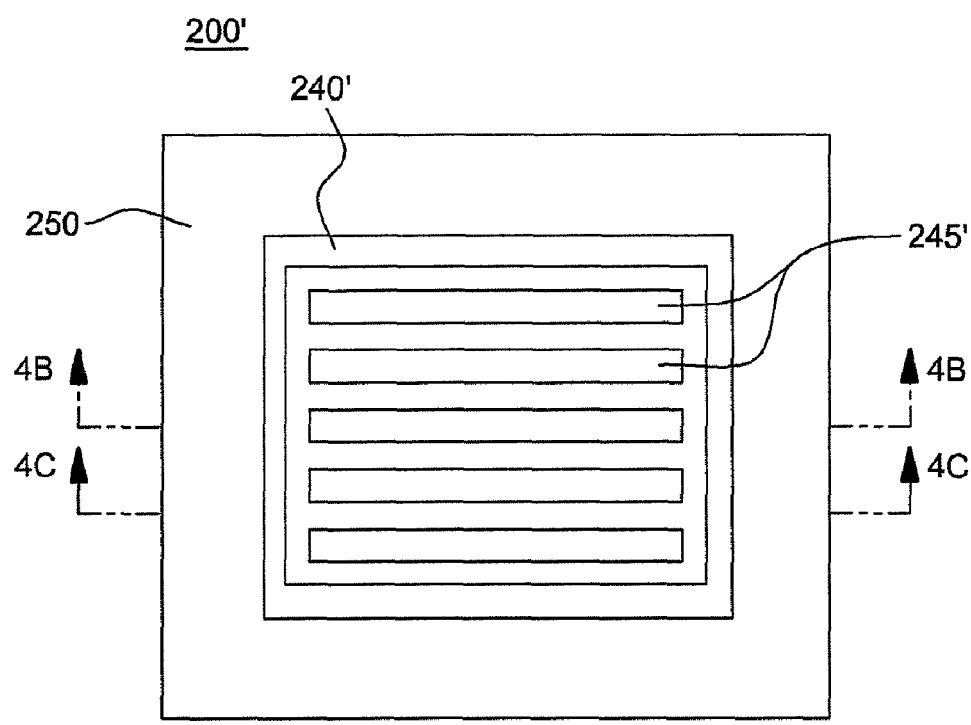
FIG. 4A is a cross-sectional plan view of an alternate embodiment of a cooled electronic module, wherein the solder material is in situ-formed into a plurality of plate fins extending from the base within the coolant flow chamber, in accordance with an aspect of the present invention.
Figure 4B:
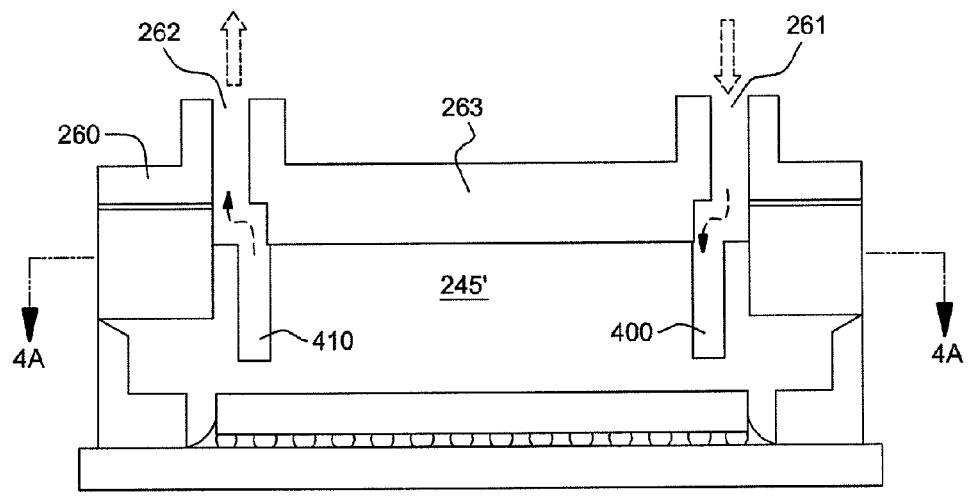
FIG. 4B is a cross-sectional elevational view of the cooled electronic module of FIG. 4A, taken along line 4B-4B, in accordance with an aspect of the present invention.
Figure 4C:
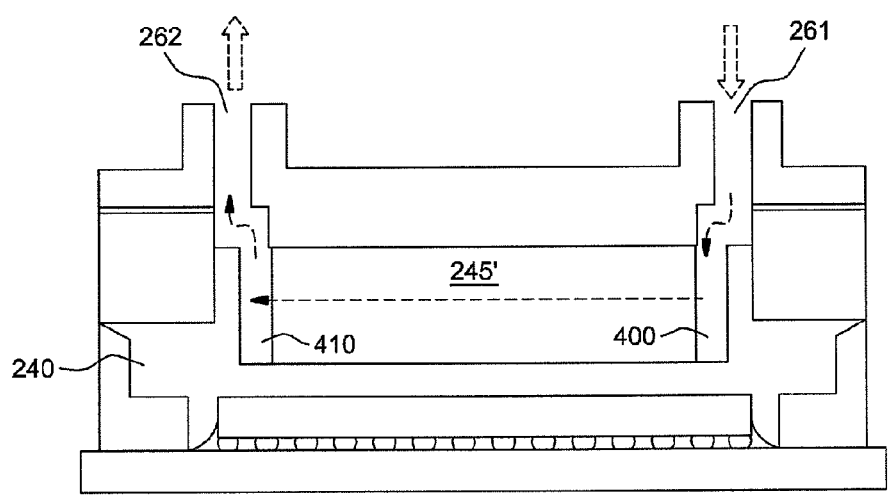
FIG. 4C is a cross-sectional elevational view of the cooled electronic module of FIG. 4A, taken along line 4C-4C, in accordance with an aspect of the present invention.

FIGS. 4A-4C depict an alternate embodiment of a cooled electronic module 200', in accordance with an aspect of the present invention. This cooled electronic module 200' is analogous to cooled electronic module 200 of FIG. 2, and manufactured as described above in connection with FIGS. 3A-3K. The difference, however, is that the solder shaping tool 300 would be differently configured to provide for creation of a plurality of plate fins 245' from solder material 240'. In one embodiment, the plurality of plate fins 245' are created to run parallel to each other, as illustrated in FIG. 4A. A space is provided at one end of the plurality of plate fins 245' to function as the coolant inlet plenum 400 (see FIGS. 4B & 4C), and a space is provided at the other end of the plurality of plate fins 245' to function as the coolant outlet plenum 410. The central portion 263 of manifold cover plate 260 is again configured to contact the upper surfaces of the plurality of plate fins 245', as illustrated in FIGS. 4B & 4C. When in operation, liquid coolant passes through coolant inlet port 261 and across the plurality of plate fins 245', and then out through coolant outlet port 262.

Note that the pin fin and plate fin solder material configurations discussed above are provided by way of example only.

Figure 5:
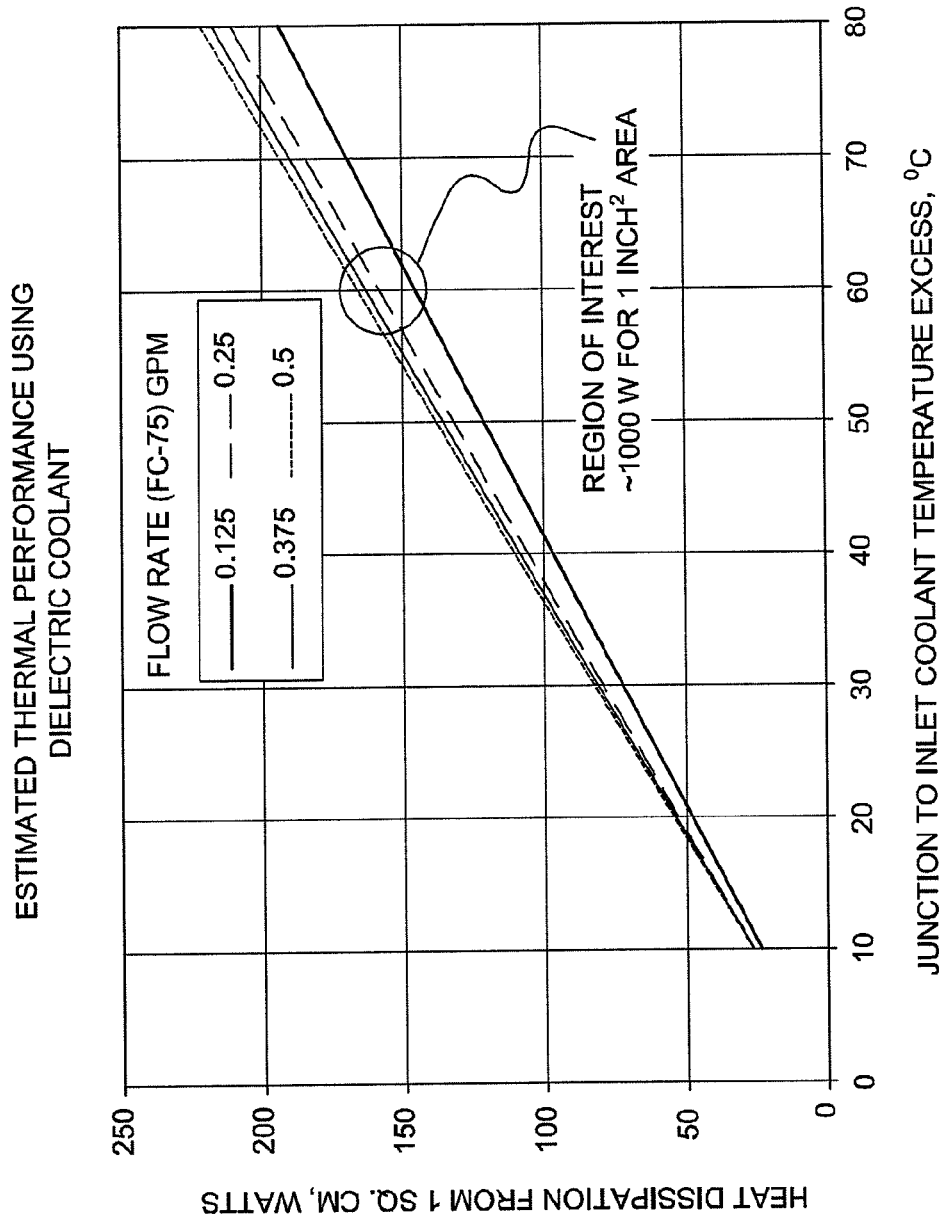
FIG. 5 is a graph of estimated thermal performance of a cooling apparatus, fabricated in accordance with an aspect of the present invention.

FIG. 5 illustrates results of an analysis performed to show thermal performance of a cold plate structure, fabricated as described herein. A 1 cm×1 cm silicon chip of 0.75 mm thickness is considered, and FC-75 coolant is assumed to be the dielectric coolant. Also, the solder fin structures are each assumed to have 0.1 mm fin thickness, channel spacing and base thickness, and be 1 mm tall. The heat removal rates presented in FIG. 5 show significant cooling in the 1 kW range is possible from a 1 square inch footprint area for a 60° C. temperature excess between the active integrated circuit chip surface and the inlet fluid for the coolant flow rates considered.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus comprising:
   a solder material attached to a device surface to be cooled of an electronic device to be cooled, the device surface to be cooled comprising a main surface of the electronic device, and the electronic device further comprises at least one side surface extending from an edge of the main surface of the electronic device, the solder material being a thermally conductive material, and being in situ-configured on the device surface to be cooled as a base with a plurality of fins extending therefrom; and
   wherein the solder material comprising the base with the plurality of fins extending therefrom is a single, monolithic structure metallurgically bonded to the device surface to be cooled and the solder material contacts and at partially covers the at least one side surface of the electronic device to be cooled.

2. The cooling apparatus of claim 1, wherein the single, monolithic structure defines part of an in situ-formed cold plate metallurgical bonded to the device surface to be cooled.

3. The apparatus of claim 1, wherein the electronic device comprises at least one of an integrated circuit chip, multiple integrated circuit chips, a single chip module or a multichip module, and wherein the base of the configured solder material is thermally attached directly to the device surface to be cooled via the metallurgical bond.

4. The cooling apparatus of claim 1, wherein the solder material comprises indium.

5. The apparatus of claim 1, further comprising a housing structure surrounding the solder material and the device surface to be cooled, the housing structure comprising a manifold cover plate with a coolant inlet port and a coolant outlet port, and wherein the manifold cover plate contacts at least some fins of the plurality of fins extending from the base of the single, monolithic structure, the housing structure defining a coolant flow chamber, wherein the plurality of fins extend within the coolant flow chamber.

6. The cooling apparatus of claim 1, further comprising a housing structure surrounding the solder material and the device surface to be cooled, the housing structure defining a coolant flow chamber, wherein the plurality of fins of the solder material extend within the coolant flow chamber and heat is transferred via convection from the plurality of fins of the solder material to coolant within the coolant flow chamber.

7. The cooling apparatus of claim 6, wherein the solder material contacts and forms a liquid-tight seal with a lower support structure of the housing structure.

8. The cooling apparatus of claim 6, wherein the solder material further bonds a lower support structure of the housing structure to an upper support structure of the housing structure.

9. The cooling apparatus of claim 8, wherein the lower support structure of the housing structure comprises a chamfer where the upper support structure contacts the lower support structure, the chamfer being filled by the solder material.

10. A cooled electronic module comprising:
    a substrate and at least one electronic device attached thereto; and
    a cooling apparatus for cooling a device surface of an electronic device of the at least one electronic device, the cooling apparatus comprising:
    a solder material metallurgically bonded to the device surface to be cooled of the electronic device, the device surface to be cooled comprising a main surface of the electronic device, and the electronic device further comprising at least one side surface extending from an edge of the main surface of the electronic device, the solder material being a thermally conductive material and being in situ-configured on the device surface to be cooled as a base with a plurality of fins extending therefrom; and
    wherein the solder material comprising the base with the plurality of fins extending therefrom is a single, monolithic structure metallurgically bonded to the device surface to be cooled and the solder material contacts and at partially covers the at least one side surface of the electronic device to be cooled.

11. The cooled electronic module of claim 10, wherein the cooling apparatus further comprises an in situ-formed cold plate metallurgically bonded to the device surface to be cooled, the solder material comprising part of the in situ-formed cold plate, and wherein the solder material isolates connections of the at least one electronic device from coolant flowing through the cooling apparatus.

12. The cooled electronic module of claim 11, wherein the coolant comprises a dielectric coolant.

13. The cooled electronic module of claim 10, wherein the solder material comprises indium.

14. The cooled electronic module of claim 10, wherein the cooling apparatus further comprises a housing structure surrounding the solder material and the device surface to be cooled, the housing structure comprising a manifold cover plate with a coolant inlet port and a coolant outlet port, and wherein the housing structure defines a coolant flow chamber, wherein the plurality of fins of the solder material extend within the coolant flow chamber and the solder material forms a liquid-tight seal isolating coolant within the coolant flow chamber from an active surface of the electronic device to be cooled, the active surface and the main surface to be cooled being opposed, parallel surfaces of the electronic device.

15. The cooled electronic module of claim 14, wherein the plurality of fins comprise at least one of a plurality of pin fins extending from the base of the solder material or a plurality of plate fins extending from the base of the solder material.

16. The cooled electronic module of claim 10, further comprising a housing structure surrounding the solder material and the device surface to be cooled, the hot, sing structure defining a coolant flow chamber, wherein the plurality of fins of the solder material extend within the coolant flow chamber and heat is transferred via convection from the plurality of fins of the solder material to coolant within the coolant flow chamber.

17. The cooled electronic module of claim 16, wherein the solder material forms a fluid-tight seal isolating the coolant within the coolant flow chamber from an active surface of the electronic device to be cooled, the active surface and the main surface to be cooled being opposed, parallel surfaces of the electronic device.

18. The cooled electronic module of claim 16, wherein the solder material contacts and forms a liquid-tight seal with a lower support structure of the housing structure.

19. The cooled electronic module of claim 16, wherein the solder material bonds a lower support structure of the housing structure to an upper support structure of the housing structure.

20. The cooled electronic module of claim 16, wherein the lower support structure of the housing structure comprises a chamfer where the upper support structure contacts the lower support structure, the chamfer being filled by the solder material.

* * * * *